(12) United States Patent
Botma et al.

(10) Patent No.: US 7,507,976 B2
(45) Date of Patent: Mar. 24, 2009

(54) LITHOGRAPHIC APPARATUS, BEAM DELIVERY SYSTEMS, PRISMS AND DEVICE MANUFACTURING METHOD

(75) Inventors: Hako Botma, Eindhoven (NL); Ewoud Vreugdenhil, Valkenswaard (NL); Joe Sakai, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 289 days.

(21) Appl. No.: 11/443,451

(22) Filed: May 31, 2006

(65) Prior Publication Data

US 2008/0067424 A1 Mar. 20, 2008

(51) Int. Cl.
*G02B 5/04* (2006.01)
(52) U.S. Cl. .................. 250/492.2; 250/492.1; 359/487; 430/269; 372/25; 372/30; 372/55
(58) Field of Classification Search .............. 250/492.1, 250/492.2; 359/487; 430/269; 372/25, 30, 372/55
See application file for complete search history.

(56) References Cited

U.S. PATENT DOCUMENTS

| | | | |
|---|---|---|---|
| 6,980,358 B2 * | 12/2005 | Thonn et al. ................. 359/352 |
| 7,230,964 B2 * | 6/2007 | Das et al. ....................... 372/55 |
| 2002/0039694 A1 * | 4/2002 | Scheiberlich et al. ......... 430/30 |
| 2002/0191654 A1 * | 12/2002 | Klene et al. .................... 372/25 |
| 2003/0043876 A1 * | 3/2003 | Lublin et al. ................... 372/55 |
| 2003/0091087 A1 * | 5/2003 | Ershov et al. .................. 372/55 |
| 2003/0219056 A1 * | 11/2003 | Yager et al. .................... 372/57 |
| 2004/0022291 A1 * | 2/2004 | Das et al. ....................... 372/55 |
| 2004/0105479 A1 * | 6/2004 | Klene et al. .................... 375/55 |
| 2006/0007978 A1 * | 1/2006 | Govorkov et al. ............. 372/55 |

* cited by examiner

*Primary Examiner*—Jack I Berman
*Assistant Examiner*—Michael Maskell
(74) *Attorney, Agent, or Firm*—Sterne, Kessler, Goldstein & Fox P.L.L.C.

(57) ABSTRACT

A beam directing element configured to receive a substantially collimated input beam of predetermined wavelength propagating in a first direction and to output a substantially collimated output beam in a second direction includes a prism formed of a transparent material and having input and output faces, wherein the internal angle between the input face and the output face is such that when the input beam is incident on the input face substantially at Brewster's angle, it is internally incident on the output face at Brewster's angle. The beam directing element is useful in lithography, for example in beam delivery systems.

17 Claims, 4 Drawing Sheets

LITHOGRAPHIC APPARATUS, BEAM DELIVERY SYSTEMS, PRISMS AND DEVICE MANUFACTURING METHOD

BACKGROUND OF THE INVENTION

1. Field of the Invention

The present invention relates to a lithographic apparatus, beam delivery systems, prisms and to device manufacturing methods.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

A lithographic apparatus requires a high-intensity, narrow-band light source. Early lithographic apparatus used high-pressure mercury vapor lamps and filters to select a single emission line. However, the drive to fabricate components with ever smaller feature sizes has necessitated the use of shorter wavelengths. Thus excimer lasers, e.g. with outputs at 248, 193 or 157 nm, are now commonly used. Such a laser is a large device with a high power consumption so is commonly located outside of the clean room containing the lithographic apparatus with the laser beam being "piped" to the lithographic apparatus by a beam delivery system. This is possible because the laser beam is well collimated and has a small cross-section. A beam delivery system may involve multiple, for example, at least two and typically 3 to 6, reflections of the beam by high-reflectivity mirrors oriented at 45° to the beam axis.

Recently, improvements of the resolution of lithography apparatus have been made by control of the polarization of the exposure radiation. Although the output of an excimer laser has a high degree of polarization, this is often reduced by the beam delivery system, which may involve multiple mirrors in the p-mode, so that a clean-up polarizer must be provided in the illumination system of the lithographic apparatus to achieve a desired high degree of polarization, e.g. >93%. The clean-up polarizer unavoidably reduces the intensity of the beam of radiation, reducing throughput.

SUMMARY OF THE INVENTION

It is therefore desirable to provide an improved beam delivery system and/or lithographic apparatus in which a high degree of polarization of the beam of radiation can be achieved with reduced intensity loss.

According to an embodiment of the invention, there is provided a lithographic apparatus having a beam directing element configured to receive a substantially collimated input beam of predetermined wavelength propagating in a first direction and to output a substantially collimated output beam in a second direction, the beam directing element comprising a prism formed of a transparent material and having input and output faces, wherein the internal angle between the input face and the output face is such that when the input beam is incident on the input face substantially at Brewster's angle, it is internally incident on the output face at Brewster's angle.

According to an embodiment of the invention, there is provided a beam delivery system for conducting a beam of substantially collimated radiation of predetermined wavelength from a radiation source to a lithographic apparatus, the beam delivery system having a beam directing element configured to receive the beam as an input beam propagating in a first direction and to output a substantially collimated output beam in a second direction, the beam directing element comprising a prism formed of a transparent material and having input and output faces, wherein the internal angle between the input face and the output face is such that when the input beam is incident on the input face substantially at Brewster's angle, it is internally incident on the output face at Brewster's angle.

According to an embodiment of the invention, there is provided a prism formed of a transparent material and having input and output faces, wherein the internal angle between the input face and the output face is such that when an input beam is incident on the input face substantially at Brewster's angle, it is internally incident on the output face at Brewster's angle and leaves the prism as an output beam.

According to an embodiment of the invention, there is provided a device manufacturing method using the above apparatus, system or prism.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
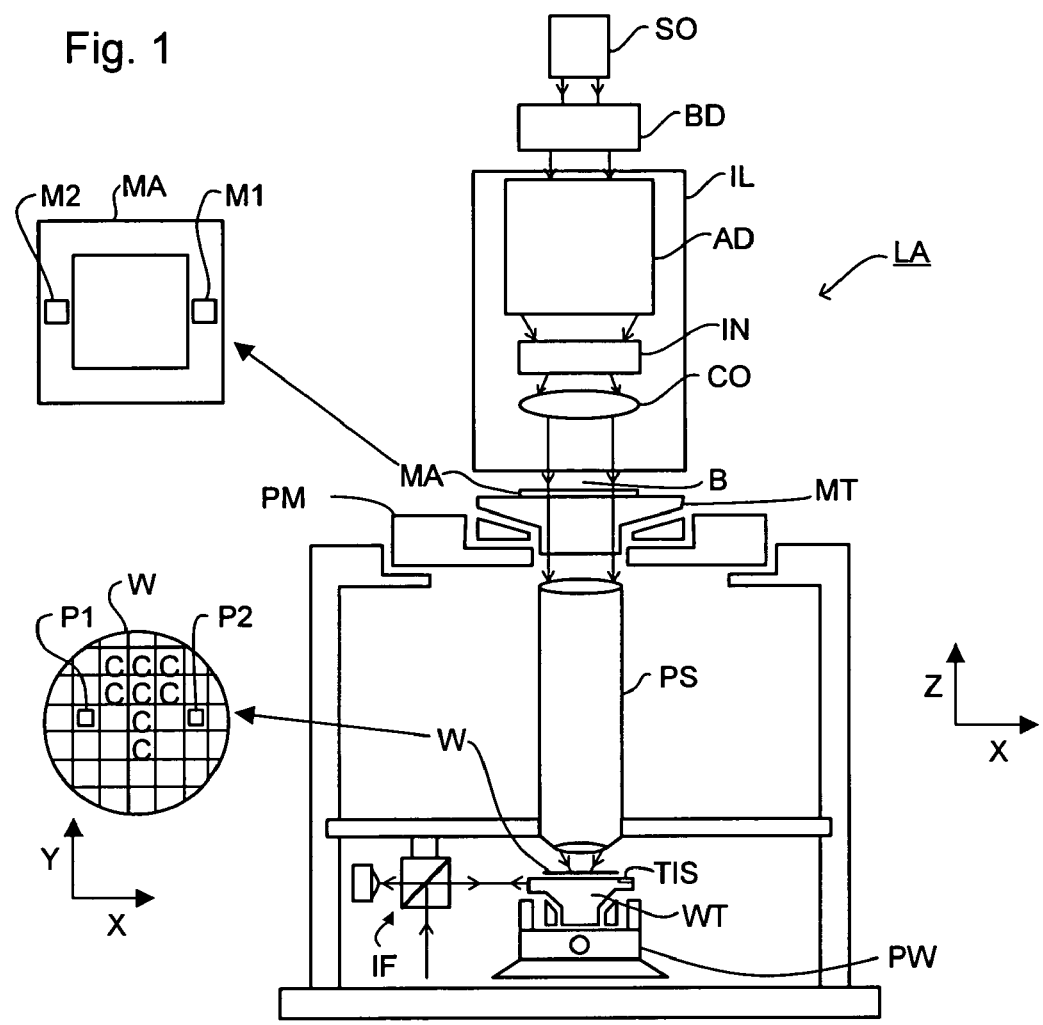
FIG. 1 depicts a lithographic apparatus according to an embodiment of the invention.

FIG. 1 schematically depicts a lithographic apparatus LA according to one embodiment of the invention. The apparatus comprises an illumination system (illuminator) IL configured to condition a radiation beam B (e.g. UV radiation or DUV radiation). A support (e.g. a mask table) MT is configured to support a patterning device (e.g. a mask) MA and is connected to a first positioner PM configured to accurately position the patterning device in accordance with certain parameters. A substrate table (e.g. a wafer table) WT is configured to hold a substrate (e.g. a resist-coated wafer) W and is connected to a second positioner PW configured to accurately position the substrate in accordance with certain parameters. A projection system (e.g. a refractive projection lens system) PS is configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment markers M1, M2 and substrate alignment markers P1, P2. Although the substrate alignment markers as illustrated occupy dedicated target portions, they may be located in spaces between target portions (these are known as scribe-lane alignment markers). Similarly, in situations in which more than one die is provided on the mask MA, the mask alignment markers may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
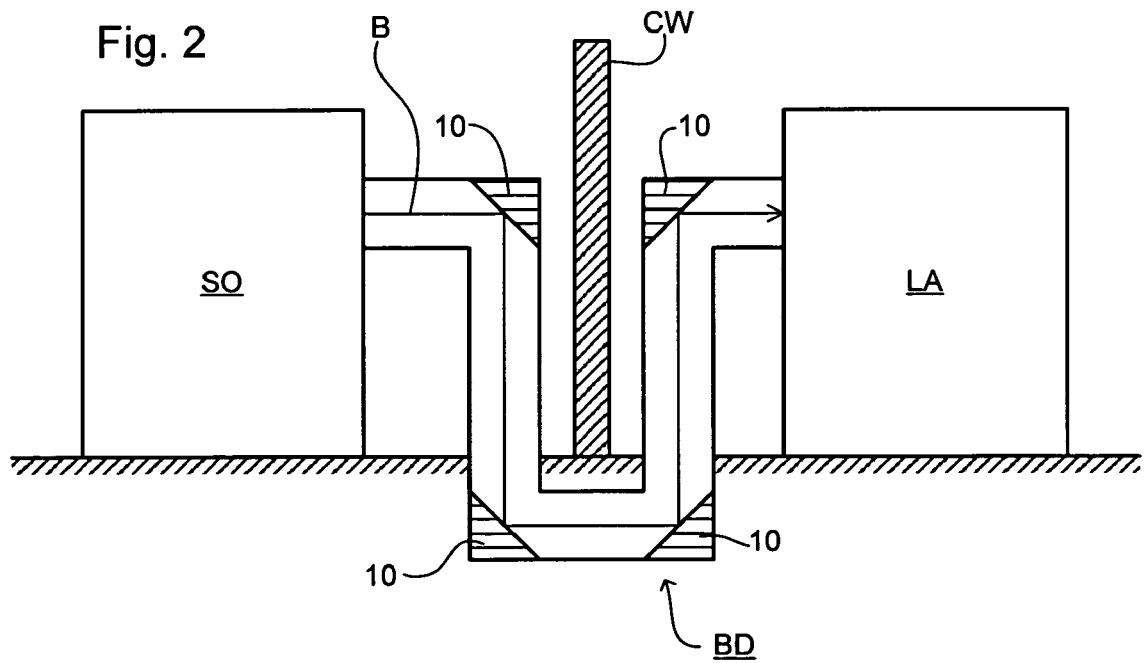
FIG. 2 depicts the source and beam delivery arrangement of the apparatus of FIG. 1.

As shown in FIG. 2, the source SO may be located some distance from the lithographic apparatus LA, for example outside the clean room so that there is a wall CW between the source and lithographic apparatus. This is because the laser need not be kept in a clean environment—which is expensive to operate—and also ensures that any gases released during maintenance of the laser do not contaminate the clean room. The beam delivery system BD, often referred to as the beam delivery pipe, conducts the beam B from the source SO to the lithographic apparatus LA, for example under the wall CW. The beam delivery system therefore has several beam diverting elements to direct the beam B along the required path. For convenience and to preserve the beam shape, each beam directing element diverts the beam through a right angle, i.e. 90°.

As mentioned above, conventionally mirrors have been used to divert the beam but often mix polarization modes and do not provide 100% transmission of the desired polarization component. The present invention therefore proposes to use prisms, oriented such that the beam B is incident on input and output faces at the Brewster angle, as beam diverting elements. Such elements have the advantage that they transmit 100% of the p-mode polarization component whilst attenuating the s-mode component by about 28% per surface. The invention can provide elements that divert the beam by desired angles, including 45° and 90°. The latter angle can achieved by use of two prisms imparting a 45° angle change or by single prisms in which the beam undergoes one or two internal reflections.

Figure 3:
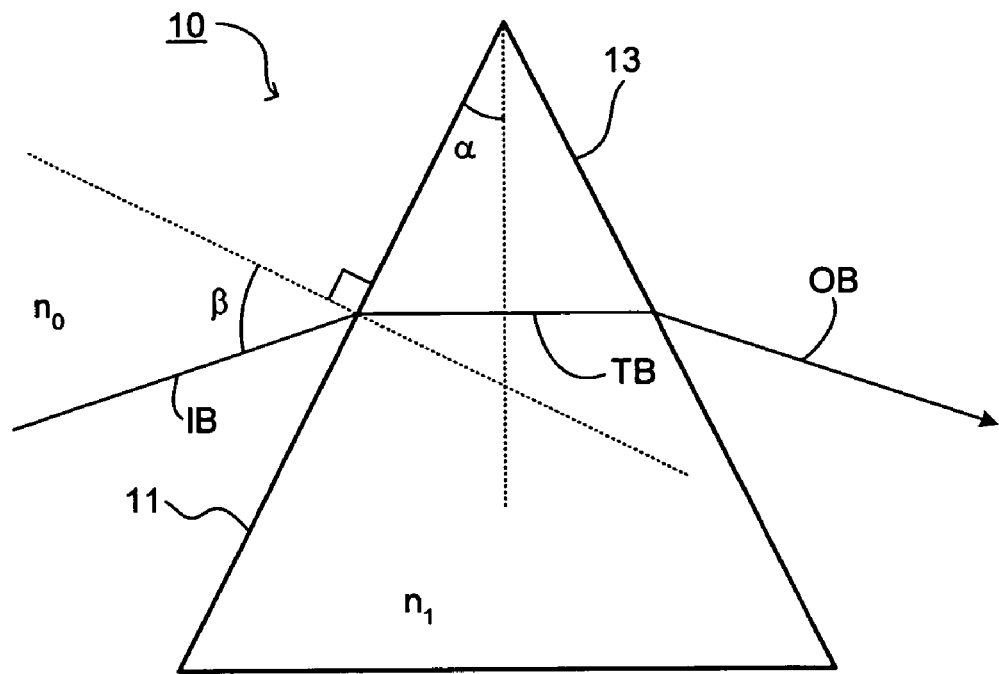
FIG. 3 is a diagram used in explaining the angle change imparted by a prism on a beam incident at the Brewster angle.

FIG. 3 shows in cross-section a prism 10 having a constant cross-section in the form of an isosceles triangle, characterized by its top half angle, α. Incident beam IB is incident on a first face 11 of the prism 10 at an angle β substantially equal to Brewster's angle, i.e.:

$$\tan \beta = n_1/n_0 \qquad (1)$$

where $n_1$, is the refractive index of the material of the prism at the wavelength of interest and $n_0$ is the refractive index of the surrounding medium at that wavelength. It is then transmitted as transmitted beam TB, is incident on a second face 13 of the prism at Brewster's angle and exits as output beam OB. According to Snell's law, to enable this the following equation must be satisfied:

$$\sin(\beta) = n_1/n_0 \sin(\alpha) \qquad (2)$$

Since $n_1$, $n_0$ and hence β are determined by the material of the prism and the surrounding medium, the angle α and the angle change imparted by the prism, which is 2(β−α), is determined by the choice of materials. Thus assuming the surrounding medium has a refractive index of 1, the following values obtain:

TABLE 1

| index n | Brewster angle, β | A | β-α |
|---|---|---|---|
| 1.4 | 54.5 | 35.5 | 18.9 |
| 1.45 | 55.4 | 34.6 | 20.8 |
| 1.5 | 56.3 | 33.7 | 22.6 |
| 1.55 | 57.2 | 32.8 | 24.3 |
| 1.6 | 58.0 | 32.0 | 26.0 |
| 1.65 | 58.8 | 31.2 | 27.6 |
| 1.7 | 59.5 | 30.5 | 29.1 |
| 1.75 | 60.3 | 29.7 | 30.5 |
| 1.8 | 60.9 | 29.1 | 31.9 |
| 1.85 | 61.6 | 28.4 | 33.2 |
| 1.9 | 62.2 | 27.8 | 34.5 |
| 1.95 | 62.9 | 27.2 | 35.7 |
| 2 | 63.4 | 26.6 | 36.9 |
| 2.05 | 64.0 | 26.0 | 38.0 |
| 2.1 | 64.5 | 25.5 | 39.1 |
| 2.15 | 65.1 | 24.9 | 40.1 |
| 2.2 | 65.6 | 24.4 | 41.1 |
| 2.25 | 66.0 | 24.0 | 42.1 |
| 2.3 | 66.5 | 23.5 | 43.0 |
| 2.35 | 67.0 | 23.1 | 43.9 |
| 2.4 | 67.4 | 22.6 | 44.8 |
| 2.45 | 67.8 | 22.2 | 45.6 |
| 2.5 | 68.2 | 21.8 | 46.4 |

Figure 4:
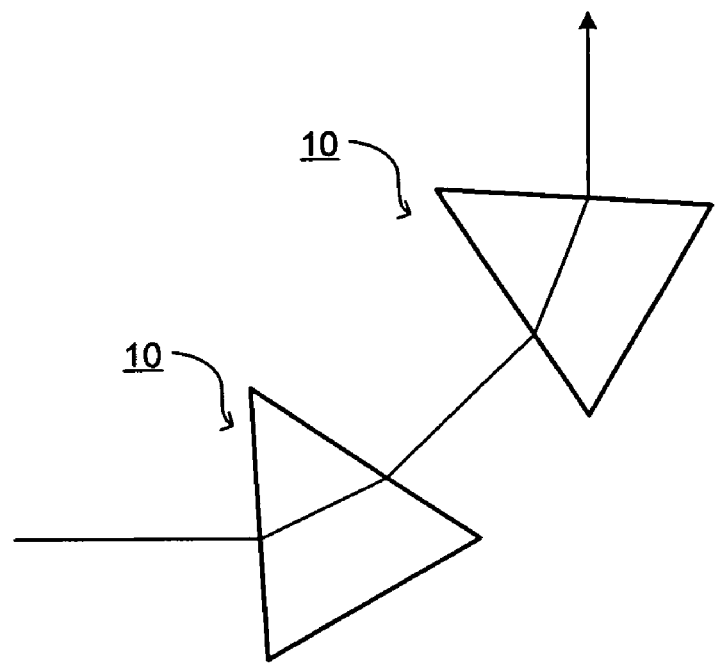
FIG. 4 depicts in cross-section a beam diverting element according to an embodiment of the invention.

Therefore, to achieve a 90° angle change with a single prism requires a material with a refractive index of more than 2.4, which is unfeasible for most wavelengths. However, a desirable 90° angle change can be achieved with two prisms, each providing a 45° angle change, which can be obtained using a material with a refractive index of about 1.5, e.g. $CaF_2$ at 193 nm (n=1.5014) or Quartz at 248 nm (n=1.508). It is desirable that the material used should exhibit no significant intrinsic or stress-induced birefringence so that the polarization state of the transmitted beam is not spoiled. An arrangement of such prisms is shown in FIG. 4. The half top angle α of about 33° is manufacturable and, as discussed below, the invention allows reasonable tolerances in prism angle and placement. Such an arrangement has an advantage that there are four surfaces at which the p-mode polarization component is preferentially transmitted and the s-mode attenuated.

Figure 5:
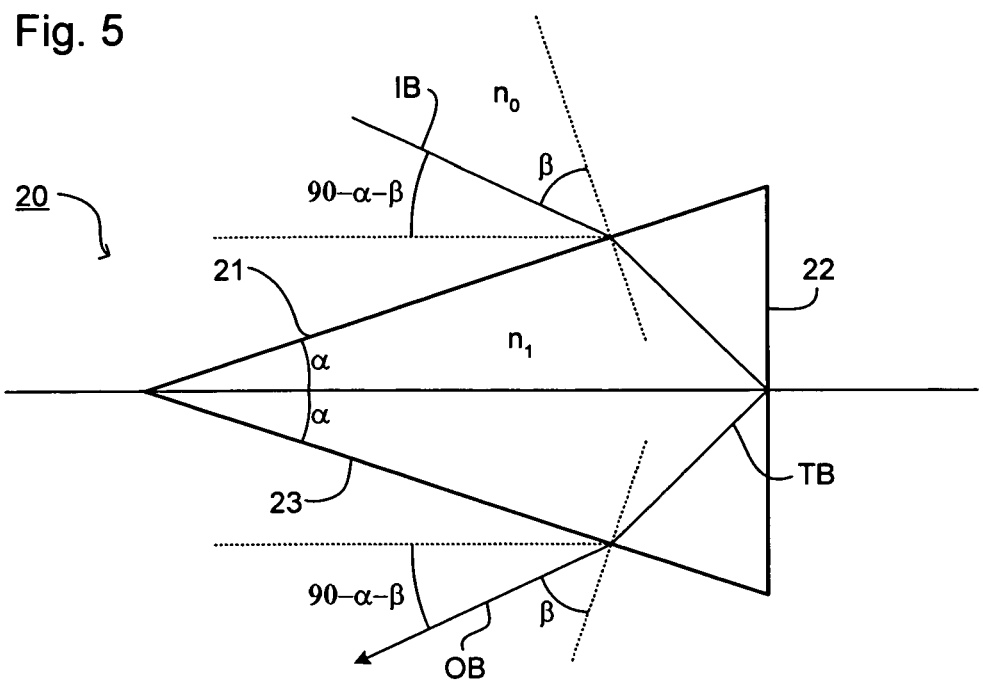
FIG. 5 depicts the angle change imparted by a prism on a beam incident at the Brewster angle and undergoing an internal reflection.

A greater angle change can be obtained using a prism in which the beam is incident on entrance and exit surfaces at Brewster's angle and also undergoes one or more internal reflections. FIG. 5, by way of example, shows a prism 20 with constant cross-section in the form of an isosceles triangle in which the incident beam IB is at Brewster's angle β, the transmitted beam TB makes one internal reflection and the output beam OB is also at Brewster's angle.

Figure 6:
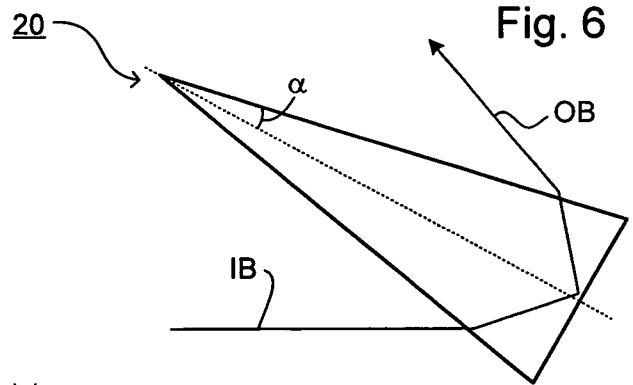
FIG. 6 depicts in cross-section a beam diverting element according to another embodiment of the invention.

The prism 20 again has a half-top angle α, a first face 21, a second face 22 and a third face 23, and from geometric considerations it can be seen that the angle change is $2(\alpha+\beta)$. β is determined by the refractive indices of the material of the prism and the surrounding medium but α can be chosen and hence determines the angle change. A 90° angle change therefore is apparently not possible with such a prism as it requires $(\alpha+\beta)=45$, or $\alpha=45-\beta$, so that with n=1.5, β=atan (n)=56.3 degree implying $\alpha=-11.3$. However, a negative angle is not in this context physically unrealistic, rather it implies the prism is a truncated triangle, with the truncated surface acting as the reflecting surface, and the input beam incident on the other side of the normal to the input surface, as discussed below. Large angle changes can however easily be provided with a triangular-section prism, as shown in FIG. 6.

Figure 7:
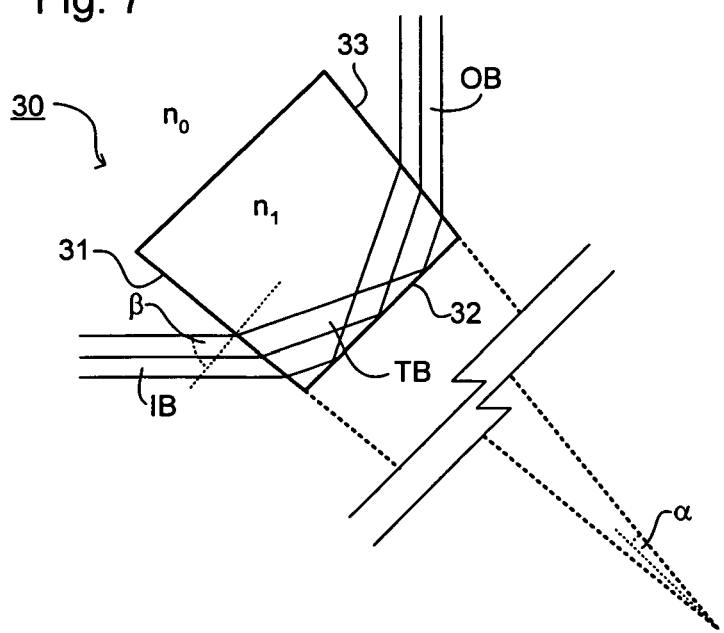
FIG. 7 depicts in cross-section a beam diverting element according to another embodiment of the invention.

An example beam directing element, according to an embodiment of the invention, using one internal reflection to effect a 90° angle change is shown in FIG. 7. It comprises a prism of transparent material, e.g. silica or quartz glass or $CaF_2$, having a refractive index $n_1$ at the wavelength of the beam B. The refractive index of the medium around the prism 30, which may be vacuum or an inert, temperature-controlled flushing gas, at that wavelength is $n_0$. The prism 30 has three operative faces: a first, input face 31, a second, reflecting face 32, and a third, output face 33. The first and third faces both meet the second face at the same internal angle 90+α, where α is the half top angle of an isosceles triangle formed by notional continuation of the first and third faces. No radiation passes through the fourth face of the prism so its orientation is irrelevant.

In use, the prism 30 is configured such that the beam B is incident on the first or input face 31 of the prism, as incident beam IB, at an angle β substantially equal to Brewster's angle. It follows that the reflected beam contains substantially only the polarization component perpendicular to the plane of incidence, i.e. parallel to the input face 31, (s-mode) and substantially all the polarization component parallel to the plane of incidence (p-mode) is transmitted. The transmission of the p-mode is close to 100% whereas the transmission of the s-mode is about 85%.

The transmitted beam TB is then substantially totally internally reflected by the second face 32 of the prism so as to be incident on the third, or output, face 33 again at Brewster's angle, and exits the device as output beam OB. There is thus a second preferential transmission of the p-mode radiation so that overall, the transmission of the p-mode is close to 100% but the transmission of the s-mode is about 72%. By appropriate arrangement of the prism 30 in the beam delivery system relative to the dominant polarization mode of the source SO, the beam delivered to the lithographic apparatus can be maximally polarized with minimum loss of intensity.

The angle α, that is the internal angle between the first face 31 and second face 32, and also between second face 32 and third face 33, is chosen so that the output beam OB propagates in a direction that is substantially perpendicular to the direction of propagation of the input beam IB. This is desirable in laying out the beam delivery system and provides that the beam directing element of the invention can be directly substituted for 45° folding mirrors in existing systems.

It is noted that the beam directing element 30 has a single internal reflection and therefore inverts the beam. In many cases that does not matter, e.g. because the beam will be passed through an optical integrator in the lithographic apparatus or because an even number of elements is used. However, the principle of the invention can also be applied to provide a beam directing element in which there are two internal reflections and so no inversion. Such an element 40 is shown in FIG. 8.

Figure 8:
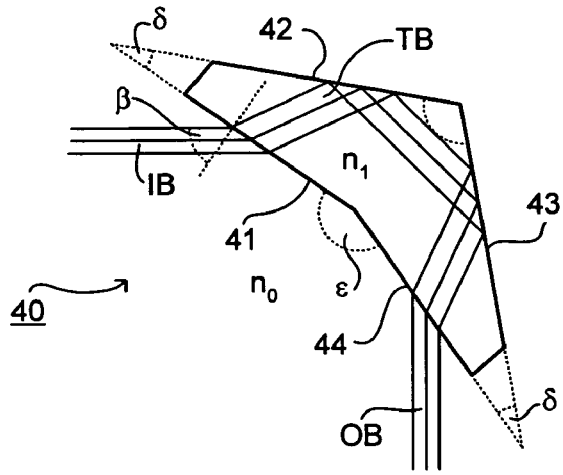
FIG. 8 depicts in cross-section a beam diverting element according to another embodiment of the invention.

As can be seen in FIG. 8, which is a cross-section, the beam directing element 40 comprises a prism made of transparent material, as in the above-described embodiment, with four flat, operative faces. It has a concave side, defined by the input and output faces 41, 44, respectively, and a convex side, defined by the second and third faces 42, 43, respectively, which reflect the beam internally. The input (first) and output (fourth) faces 41, 44 meet at an obtuse, exterior angle ϵ. The interior angles between the first and second faces and between the third and fourth faces are equal and denoted δ in the drawing so that the prism is generally symmetrical about a plane containing the edges between the first and fourth faces and between the second and third faces, in other words a plane perpendicular to the paper and containing the bisector of the angle ϵ. Thus the prism resembles in cross-section a caret (^) or a chevron with the included angle between the faces of the convex side being smaller than the included angle between the faces of the concave side.

In use, the input beam IB is incident on the first, or input face 41 at Brewster's angle β so that substantially all the p-mode polarization component passes into the transmitted beam TB. The transmitted beam TB is then substantially totally internally reflected by the second and third faces 42, 43 so as to be incident on the fourth, or output, face 44 at Brewster's angle. Again, substantially all the p-mode polarization component is transmitted into the output beam OB and the beam directing element 40 has the same overall transmission as the embodiment described above: substantially 100% for p-mode and about 72% for s-mode.

The angle ϵ are chosen so that the change in direction of propagation of the output beam OB relative to that of the input beam IB is as desired. It can be derived from geometric considerations that the angle change is $(450-2(\epsilon+\beta))°$ so that for a 90° angle change $\epsilon=180-\beta$. β is, of course determined by the refractive indices of the material of the prism and of the surrounding medium. Again from geometric considerations, it can be derived that the angle δ is fixed and given by:

$$\delta = -\tfrac{1}{2}(\epsilon/2 + a) \qquad (3)$$

where a is determined by:

$$\sin(\beta) = n_1/n_0 \sin(a) \qquad (4)$$

It should be noted that in embodiments of the invention the reflecting faces of the prisms may be provided with coatings to enhance the reflection of the beam, as appropriate. Also, where the beam to be directed is small and well-collimated, it will pass through only limited areas of the operative faces so that elsewhere the faces may be absent or unpolished. For example, corners of the prisms may be beveled or rounded, in which cases the angles described are angles between notional continuations of the effective parts of the faces.

Figure 9:
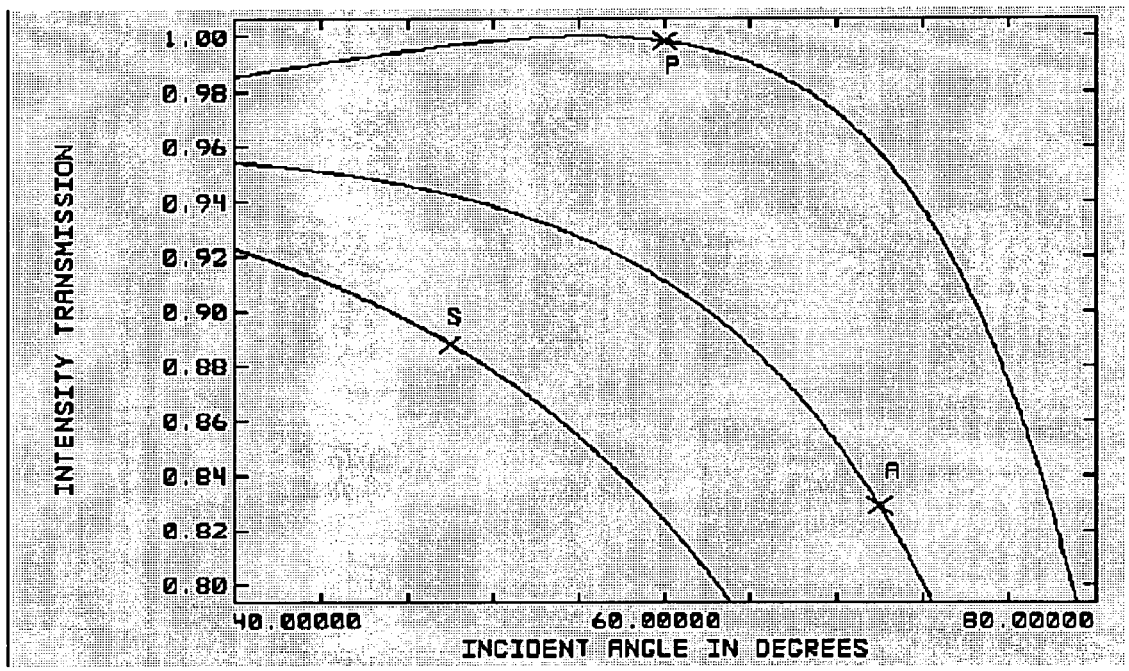
FIG. 9 is a graph of transmission versus incident angle for a surface of a beam diverting element according to an embodiment of the invention.

The transmission (per surface) of the input and output surfaces of a beam directing element according to an embodiment of the invention is shown in FIG. 9 as a function of incident angle. The lines labeled P, S and A give transmission for p-mode, s-mode and average respectively. As can be seen, the transmission of p-mode has a broad peak whereas the transmission of s-mode falls of comparatively rapidly. The prism can therefore be designed for maximum transmission of p-mode, in which case the incident angle is preferably as close as possible to the Brewster angle, for example within ±5° of the Brewster angle, within ±3° of the Brewster angle, within ±1° of the Brewster angle. Alternatively, the prism can be designed for greater rejection of the s-mode in which case an incident angle somewhat higher than the Brewster angle may be desirable.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus having a beam directing element configured to receive a substantially collimated input beam of predetermined wavelength propagating in a first direction and to output a substantially collimated output beam in a second direction, the beam directing element comprising:
   a prism formed of a transparent material, the prism comprising an input face, an output face, and a reflecting surface, the prism being configured such that
   an angle between the input face and the reflecting surface is substantially equal to an angle between the output face and the reflecting surface,
   the input face can receive an input beam at an incident angle substantially equal to Brewster's angle, and
   the reflecting surface can receive a transmitted beam from the input face and substantially reflect the transmitted beam to the output face at an internal incident angle substantially equal to Brewster's angle.

2. An apparatus according to claim 1, wherein the second direction is substantially perpendicular to the first direction.

3. An apparatus according to claim 1, wherein the reflecting surface is a first reflecting surface and the prism is configured to have a second reflecting surface, an angle between the input face and the first reflecting surface substantially equal to an angle between the output face and the second reflecting surface such that the beam is internally reflected by the first reflecting surface and then by the second reflecting surface after transmitting through the input face and before being transmitted through the output face.

4. An apparatus according to claim 1, wherein the input beam is a beam of exposure radiation.

5. An apparatus according to claim 1, wherein the lithographic apparatus comprises an illumination system configured to condition a beam of radiation and a beam delivery system configured to conduct radiation from an external source to the illumination system, and the beam directing element is part of the beam delivery system.

6. A beam delivery system for conducting a beam of substantially collimated radiation of predetermined wavelength from a radiation source to a lithographic apparatus, the beam delivery system having a beam directing element configured to receive the beam as an input beam propagating in a first direction and to output a substantially collimated output beam in a second direction, the beam directing element comprising:
   a prism formed of a transparent material, the prism comprising an input face, an output face, and a reflecting surface, the prism being configured such that
   an angle between the input face and the reflecting surface is substantially equal to an angle between the output face and the reflecting surface,
   the input face can receive an input beam at an incident angle substantially equal to Brewster's angle, and
   the reflecting surface can receive a transmitted beam from the input face and substantially reflect the transmitted beam to the output face at an internal incident angle substantially equal to Brewster's angle.

7. A device manufacturing method, comprising:
   providing a beam of radiation by conducting a beam of substantially collimated radiation of predetermined wavelength from a radiation source to a lithographic apparatus, the beam delivery system having a beam directing element configured to receive the beam as an input beam propagating in a first direction and to output a substantially collimated output beam in a second direction, the beam directing element comprising a prism formed of a transparent material, the prism comprising an input face, an output face, and a reflecting surface, the prism being configured such that an angle between the input face and the reflecting surface is substantially equal to an angle between the output face and the reflecting surface, the input face can receive an input beam at an incident angle substantially equal to Brewster's angle, and the reflecting surface can receive a transmitted beam from the input face and substantially reflect the transmitted beam to the output face at an internal incident angle substantially equal to Brewster's angle patterning the beam of radiation; and projecting the patterned beam of radiation onto a target portion of a substrate.

8. A single prism formed of a transparent material and having input and output faces, wherein the single prism is configured such that an internal angle between the input face and the output face is such that when an input beam is received at an incident angle on the input face substantially at Brewster's angle, the input beam is internally incident on the output face substantially at Brewster's angle and exits the prism as an output beam, wherein the output beam exits the single prism in a second direction substantially perpendicular to the direction of incidence of the input beam.

9. A prism according to claim 8, wherein the prism is configured to have a reflecting surface, and such that the input and output faces are at substantially equal angles to the reflecting surface such that the beam is internally reflected by the reflecting surface after transmitting through the input face and before transmission through the output face.

10. A prism according to claim 8, wherein the prism is configured to have first and second reflecting surfaces, an angle between the input face and the first reflecting surface substantially equal to an angle between the output face and the second reflecting surface such that the beam is internally reflected by the first reflecting surface and then by the second reflecting surface after transmitting through the input face and before transmission through the output face.

11. A prism according to claim 8, wherein the transparent material has a refractive index at a predetermined wavelength in a range from approximately 1.4 to 1.6.

12. A prism according to claim 8, wherein the transparent material has a refractive index at a predetermined wavelength in a range from approximately 1.45 to 1.55.

13. A prism according to claim 8, wherein the transparent material has a refractive index at a predetermined wavelength of approximately 1.5.

14. A prism according to claim 8, wherein a predetermined wavelength of the input beam is less than approximately 300 nm.

15. A prism according to claim 8, wherein a predetermined wavelength of the input beam is less than approximately 248 nm.

16. A prism according to claim 8, wherein a predetermined wavelength of the input beam is less than approximately 193 nm.

17. A prism according to claim 8, wherein a predetermined wavelength of the input beam is less than approximately 157 nm.

* * * * *